(12) United States Patent
Shykind et al.

(10) Patent No.: US 6,701,004 B1
(45) Date of Patent: Mar. 2, 2004

(54) DETECTING DEFECTS ON PHOTOMASKS

(75) Inventors: David Shykind, Sherwood, OR (US);
Chris Kenyon, Portland, OR (US);
Richard Schenker, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/470,082

(22) Filed: Dec. 22, 1999

(51) Int. Cl.[7] .................................................. G06K 9/00
(52) U.S. Cl. ........................................................ 382/149
(58) Field of Search ................................. 382/144, 149, 382/145, 147, 141

(56) References Cited

U.S. PATENT DOCUMENTS 5,308,722 A * 5/1994 Nistler ........................... 430/5
6,421,457 B1 * 7/2002 Su ............................... 382/149

* cited by examiner

*Primary Examiner*—Daniel Mariam
*Assistant Examiner*—Shefali Patel
(74) *Attorney, Agent, or Firm*—Fish & Richardson P.c.

(57) ABSTRACT

Defects on at least one photomask are detected by patterning alternating dice on a wafer with different process conditions. The different conditions, such as a length of exposure time and an optical focus condition, are configured to highlight and detect defect areas.

23 Claims, 7 Drawing Sheets

*60-Degree Phase Defect -0.30 μm de-focus*

*60-Degree Phase Defect in-focus*

*60-Degree Phase Defect +0.30 μm de-focus*

*No Phase Defect -0.30 μm de-focus*

*No Phase Defect in-focus*

*No Phase Defect +0.30 μm de-focus*

DETECTING DEFECTS ON PHOTOMASKS

BACKGROUND

This disclosure relates to masking in photolithography.

Photolithography is used to print patterns that define integrated circuits onto semiconductor wafers. Typically, a pattern on a photomask is imaged by a highly accurate imaging system onto a silicon wafer that is coated with photosensitive resist. Continued improvements in photolithography have enabled the printing of ever finer features. This has allowed the integrated circuit (IC) industry to produce more powerful and cost-effective semiconductor devices.

As IC feature sizes drop to the subwavelength range, processes involved in photolithography are facing new and more difficult challenges. For example, subwavelength distortions and defects produced during optical exposure of a photomask can cause degraded circuit performance or even a complete failure. Two emerging technologies, a phase shifting technique and an optical proximity correction (OPC), have enabled the improvements in performance of subwavelength design by reducing defects and fixing distortions.

The phase shifting technique refers to the modulation of projected light at the mask level to improve the resolution and depth of focus. Shifting the phase of the light utilizes more of the optical spectrum than with light intensity attenuation, thus enabling finer geometries. The OPC works by adding features to layouts at the mask level to minimize the effects of optical process distortions. The OPC works effectively in conjunction with the phase shifting technique to resolve distortions that result from the "proximity effects" (distortions caused by nearby objects) as well as the diffusion and loading effects of resist and etch processing.

SUMMARY

Defects on at least one photomask are detected by patterning alternating dies on a wafer with different process conditions. The different conditions, such as a length of exposure time and an optical focus condition, are configured to highlight and detect defect areas.

BRIEF DESCRIPTION OF THE DRAWINGS

Different aspects of the disclosure will be described in reference to the accompanying drawings wherein.

DETAILED DESCRIPTION

Figure 1A:
FIGS. 1A through 1E are a process flow diagram for fabricating an integrated-circuit wafer according to an embodiment of the invention.
Figure 1B:
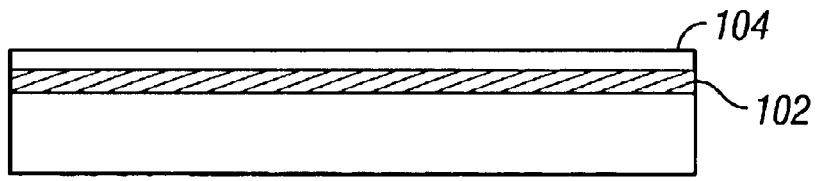
Figure 1C:
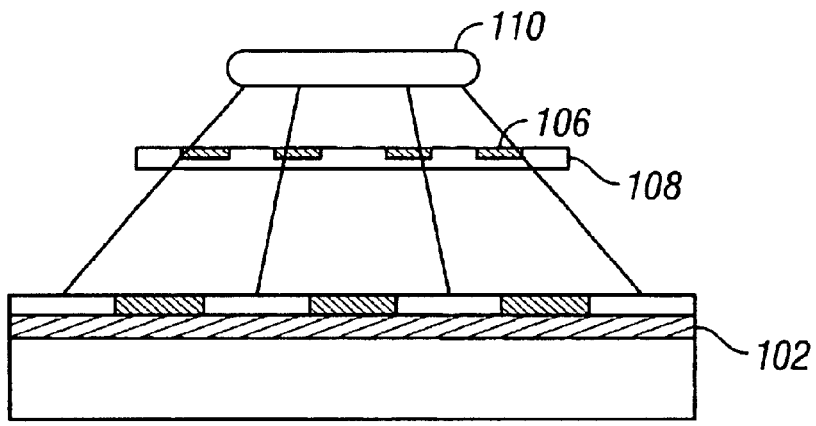
Figure 1D:
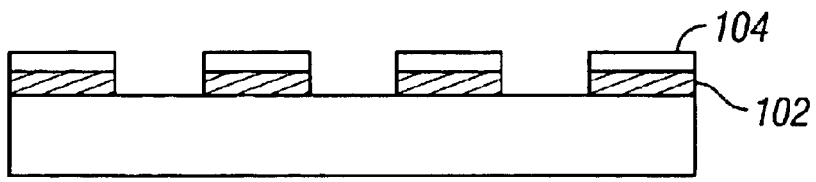
Figure 1E:
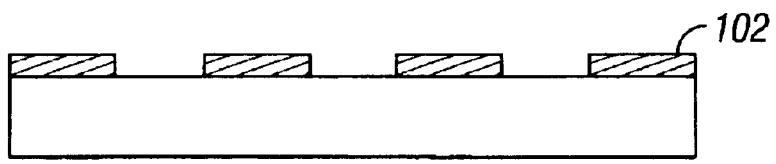

A process flow diagram for fabricating an integrated-circuit wafer is shown in FIGS. 1A through 1E. The process begins by providing a silicon substrate wafer 100 (FIG. 1A). A thin-film layer 102 is deposited on top of the substrate 100 as shown in FIG. 1B. A photosensitive resist 104 is deposited on,top of the thin-film layer 102. Next, as shown in FIG. 1C, the resist 104 is exposed and developed with a pattern 106 on a photomask or reticle 108. A beam of light from a light source 110 projects the image patterned on the photomask 108 onto the resist 104. This photo-exposure process, shown in FIG. 1C, is repeated for each die in a wafer. Finally, the thin-film layer 102 is etched (FIG. 1D) and the resist 104 is stripped away (FIG. 1E). Other patterned layers may be similarly formed and processed to leave a designed pattern on the layer 102.

Once the photolithographic process is finished, mask defects are often identified by comparing the printed images of one mask to the printed images of an identically designed mask. The comparison is performed in a wafer inspection system by identifying the locations where the images are substantially different.

Figure 2:
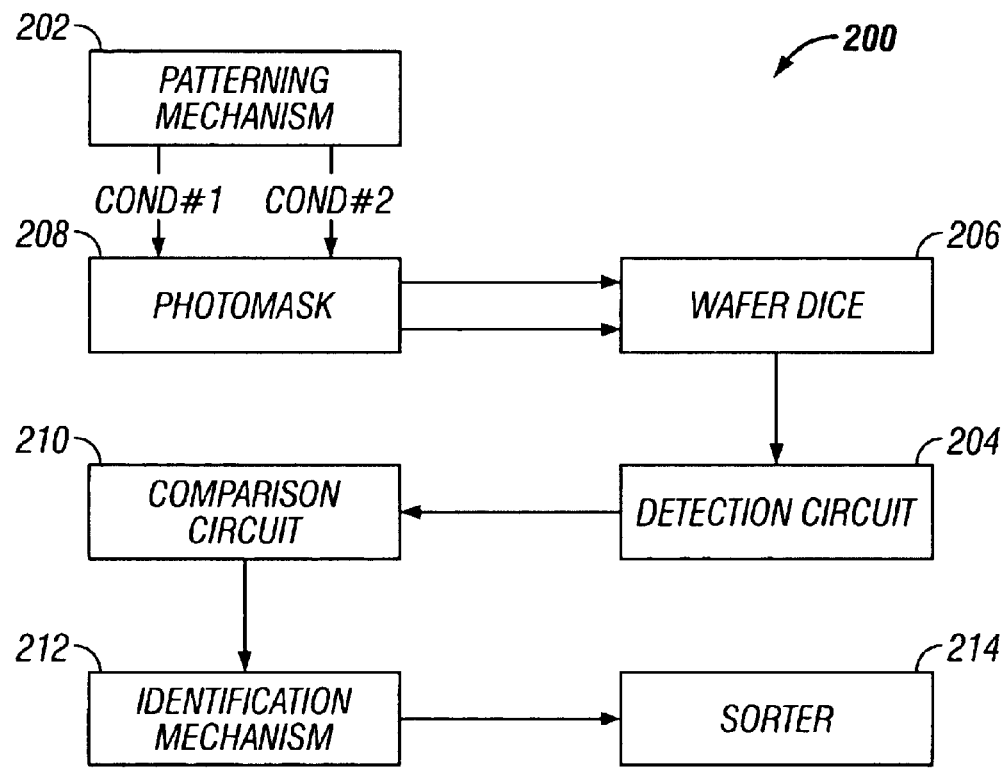
FIG. 2 is a block diagram of a mask defect inspection system.

FIG. 2 shows a block diagram of an inspection system 200 having a patterning mechanism 202 and a detection circuit 204. The patterning mechanism is configured to pattern alternating dice on a wafer 206 using photomasks 208 under different process conditions. The different conditions employed to print patterns on dice highlight defect areas on photomasks 208.

The inspection system 200 further includes a comparison circuit 210, an identification mechanism 212, and a sorter 214. The comparison circuit 210 takes the patterns printed on several sets of dice with different conditions and compares them. The identification mechanism 212 identifies features that display different patterns for same area under different process conditions. The sorter 214 then sorts the identified features to detect and flag mask defects.

The inspection system 200 incorporates various process conditions in conjunction with the phase shifting and the optical proximity correction (OPC). The incorporated process conditions include printing alternating dice with different printed images of identically designed masks, sorting defects, and controlling exposure time (dose) and focus.

Figure 3:
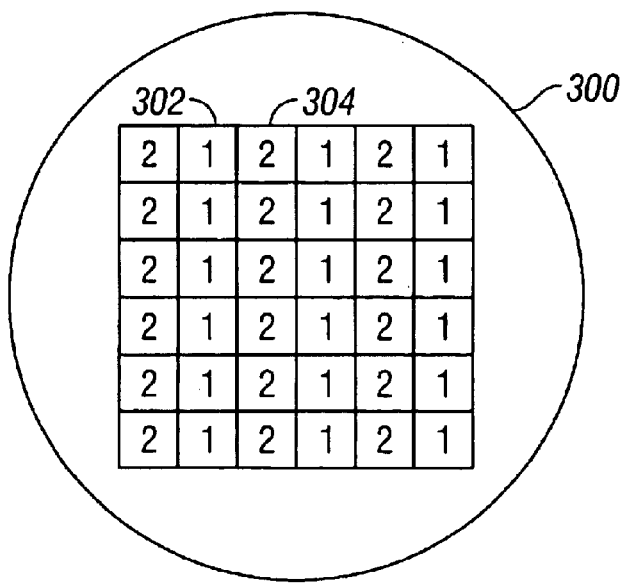
FIG. 3 is a silicon wafer configuration to detect mask defects according to an embodiment of the invention.

One embodiment of a silicon wafer configuration 300 to detect mask defects is shown in FIG. 3. Each alternating die 302, 304 (in this case, alternating column) is printed with a different process condition. The different condition is selected to highlight defect areas while keeping areas without defects unchanged. The die labeled '1' 302 is imaged under one process condition. The die labeled '2' 304 is imaged under another condition. In some embodiments, if there are two identically-designed masks available, the process conditions used for the dice '1' and '2' include the two masks or reticles. If there is only one mask available, the process conditions used include the different dose and/or focus configured to highlight defect areas.

In the case of two identically designed reticles, a die-to-die inspection is performed by comparing several sets of dice printed with each reticle. Mask error defects on a wafer are sorted from naturally occurring random defects by selecting the detected locations with different wafer patterns (i.e. defects) that only occur on multiple dice. This process of selecting only repeating defects allows defect detection at a higher sensitivity and hence enables identification of smaller mask defects.

Figure 4:
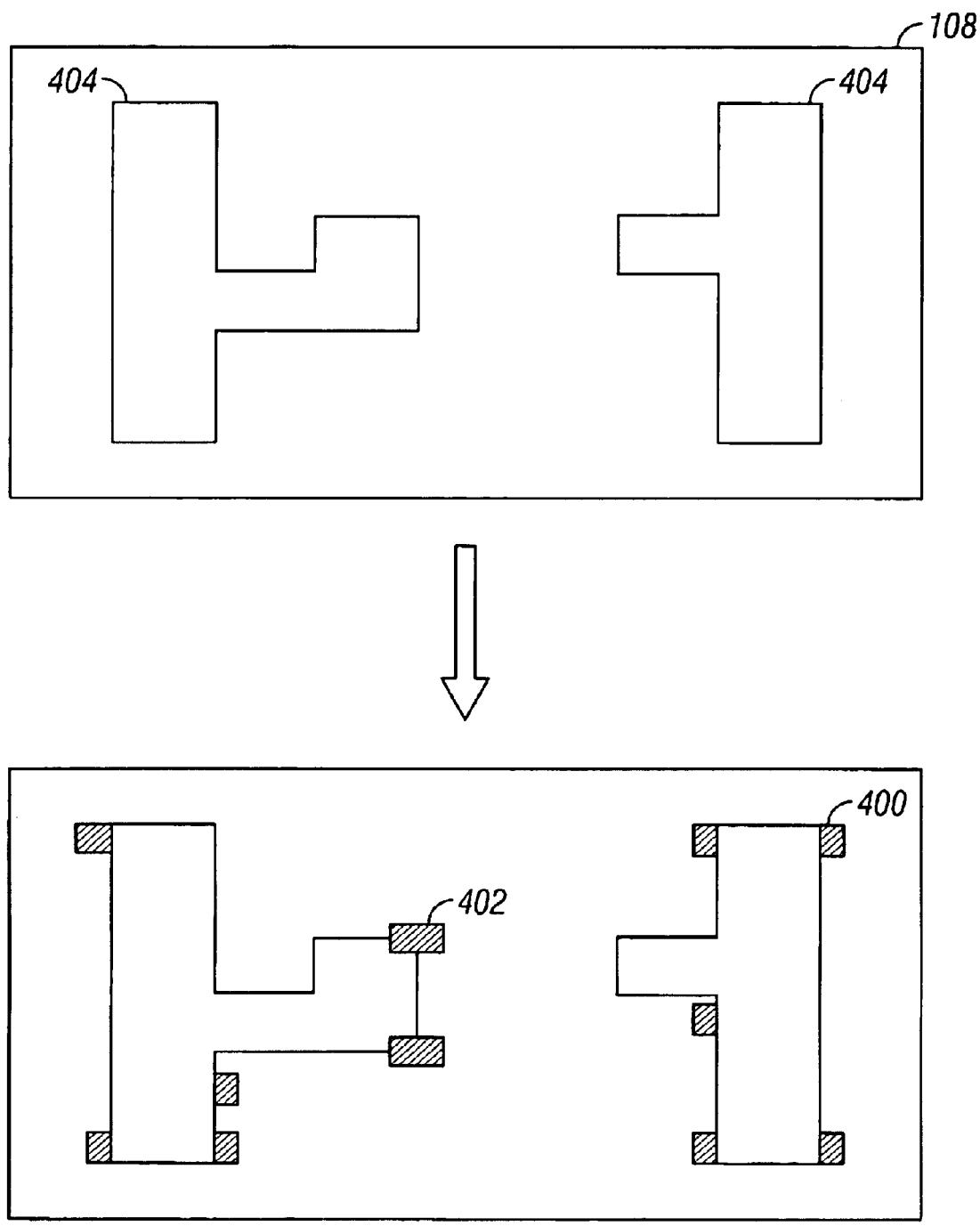
FIG. 4 is an example of optical proximity correction.

The OPC is used to improve optical lithography performance. An example of the OPC is shown in FIG. 4 where serifs 400 and corrective geometries 402 are added to line-ends and corners of patterns 404 on a reticle 108 to reduce the amount of line shrinkage or pull-back from the desired location. The technique allows the line-ends and corners to be placed closer together and hence enables smaller feature sizes to be patterned. However, it is difficult to find defects on or near serifs 400, corrective geometries 402 and other OPC features since the OPC features are smaller than the main features.

An enhanced technique to obviate difficulties encountered in finding defects near the OPC features takes advantage of an OPC feature characteristic that makes the OPC features contribute more strongly to the printed image patterns on the wafer. The sensitivity of the patterned image to different process conditions, such as variations in the image focus position and/or dose, are used. Defects near the OPC features are readily detected. For example, when a serif at the end of a line is too large, the distance between the line-end and a conjugate line-end can have an especially strong dependence on the image focus position and dose.

FIGS. 5A through 5D illustrate the enhanced technique that performs multiple tests under different process conditions. Each test with different process condition can be printed on an alternating die, like the one shown in FIG. 3, to facilitate defect detection and sorting.

Figure 5A:
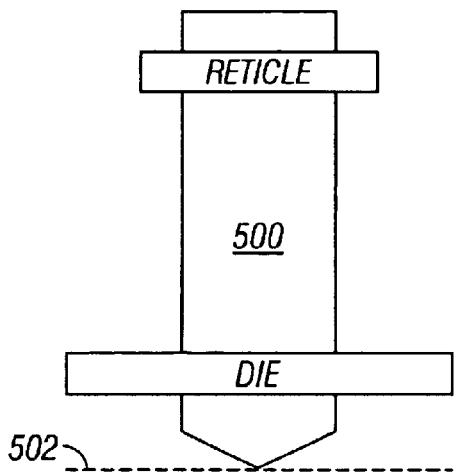
FIGS. 5A through 5D illustrate different process conditions according to an embodiment of the invention.
Figure 5B:
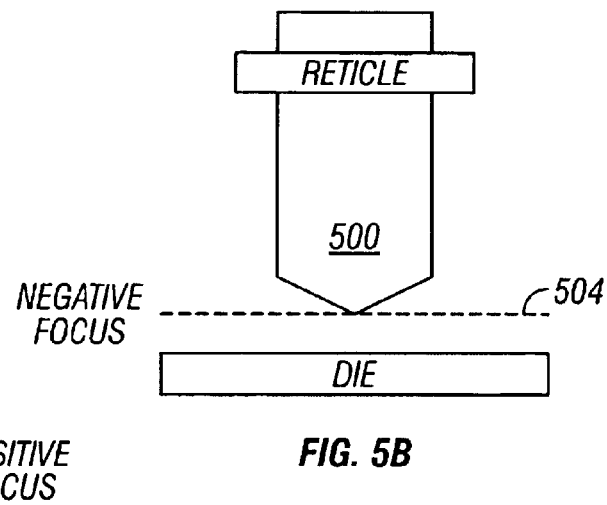
Figure 5C:
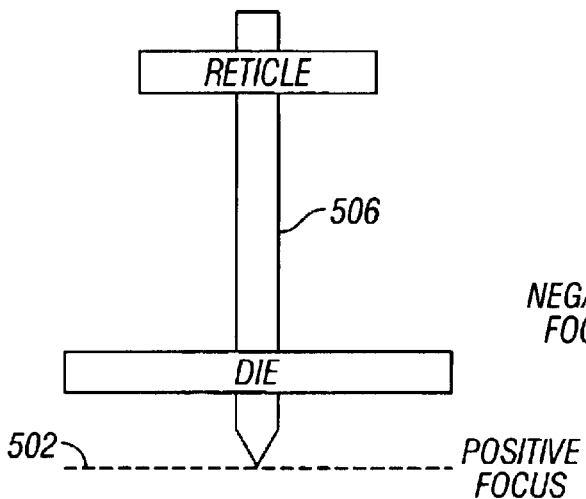
Figure 5D:
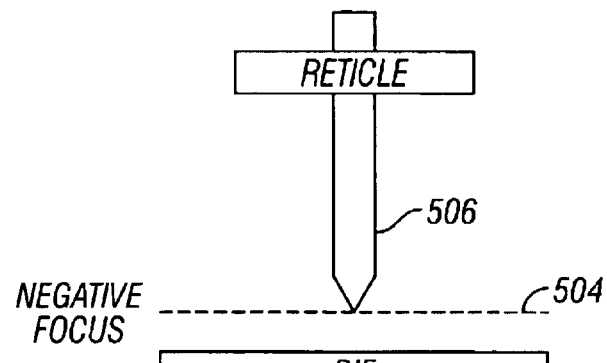

A process condition in which an image on a reticle is patterned onto a die with a high dose 500 and a positive de-focus 502 is shown in FIG. 5A. The high dose 500 is maintained by increasing the exposure time of the die. The positive de-focus 502 is created by focusing the reticle image at a position some distance beyond the die. The high dose and negative de-focus 504 condition, shown in FIG. 5B, are maintained by keeping the same exposure time but focusing the reticle image at a position some distance short of the die. Other process conditions include positive (FIG. 5C) and negative (FIG. 5D) de-focus conditions with a low dose or exposure time 506.

Figure 6:
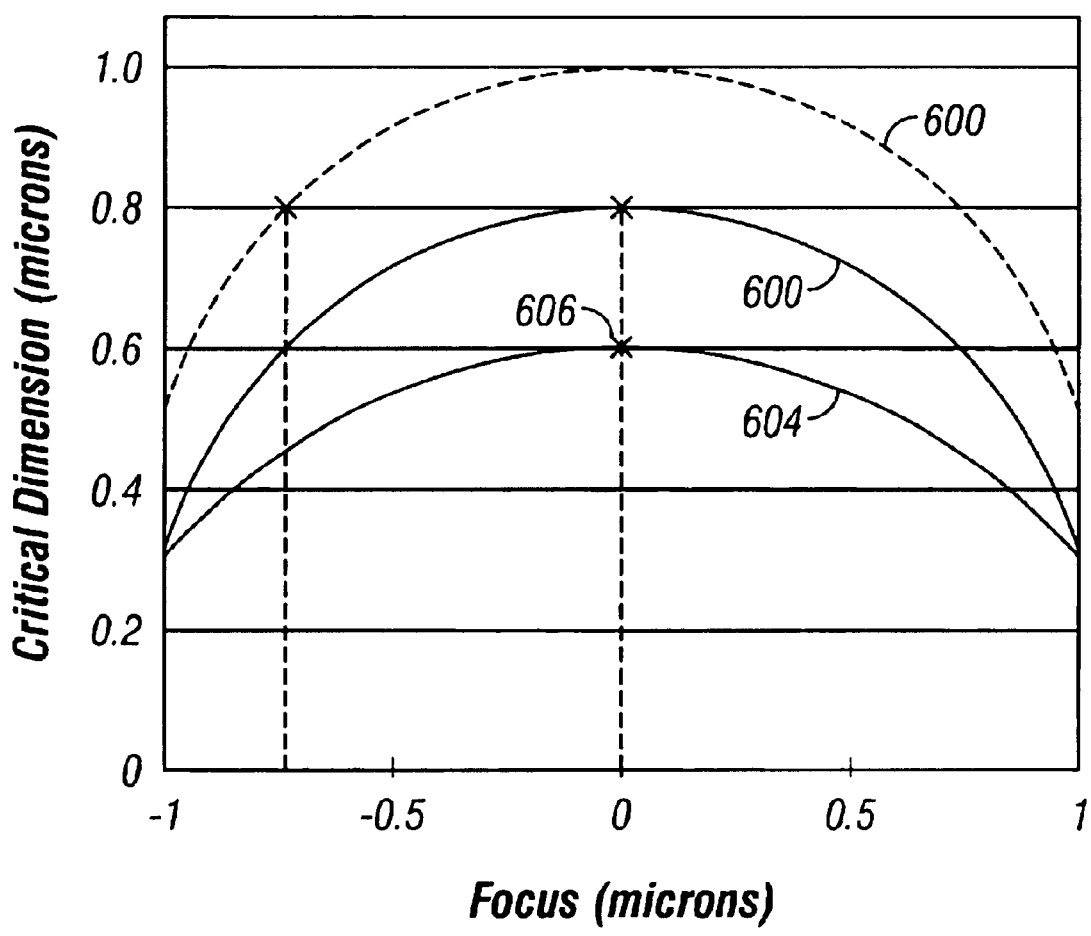
FIG. 6 shows how two different process conditions of focus and dose produce a same critical dimension for an OPC feature without defect but the critical dimension vary for a feature with defect.

The focus and dose settings are selected to optimize the detection sensitivity to mask defects near the OPC features. The selected settings minimize the number of "false" defects detected because of the differences in patterning conditions between the alternating die. For example, FIG. 6 shows how two different process conditions of focus and dose produce the same linewidth (called critical dimension) for an OPC feature without defect but the critical dimension vary for a feature with defect. Two process conditions, one 600 with lower dose and negative de-focus at approximately −0.7 microns and another 602 with higher dose but in focus, produce the same critical dimension at 0.8 microns. However, when the OPC feature contains a defect or a marginal layout design, the critical dimensions of the two process conditions vary. For example, a dose curve 604 for the same higher dose with mask defects may vary significantly to produce a critical dimension of 0.6 microns 606 at in-focus. Therefore, this characteristic of the OPC features under different process conditions can be utilized to enhance defect detection process.

The phase-shifting masks (PSMs), used in conjunction with the OPC technique, also improves lithographic patterning and semiconductor manufacturing performance. However, the PSMs in production have limited ability to find the localized phase imperfections (phase defects) in the phase shifting regions.

The PSMs are often manufactured using a voting method (described in, e.g., U.S. Pat. No. 5,308,722) where the full 180 degree phase region is defined in multiple steps to enhance the defect detection ability of the PSM and thus limit the maximum phase of the PSM phase defect. A phase corresponds to the depth of etching performed on the glass deposited on a mask. For example, if three 60-degree steps are used for defining the 180 degree phase region, a worst case phase defect would be 60degrees. Therefore, the imaging of non-180-degree phase defects is asymmetric under different focusing conditions.

Figure 7A:
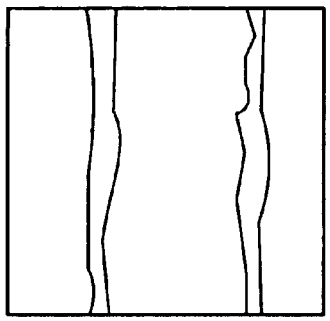
FIGS. 7A through 7F illustrate the imaging of 60-degree phase defect and no defect under different focusing conditions.
Figure 7B:
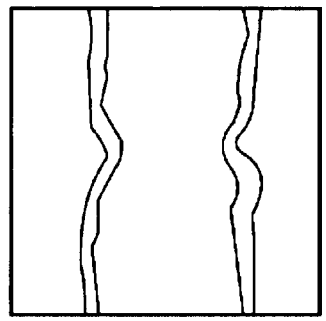
Figure 7C:
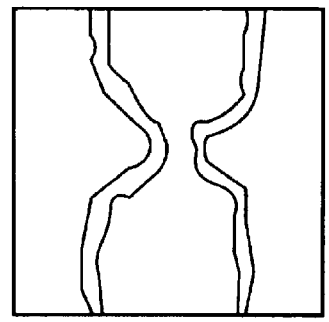
Figure 7D:
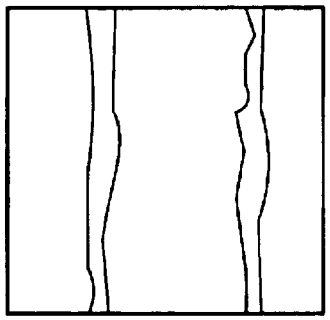
Figure 7E:
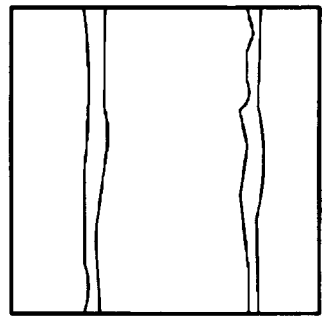
Figure 7F:
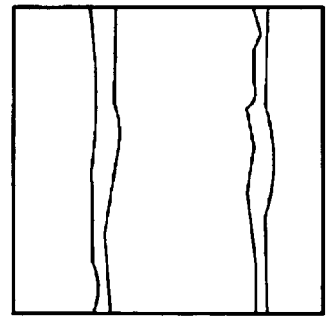

FIGS. 7A through 7C and FIGS. 7D through 7F illustrate the imaging of the 60-degree and 0-degree (i.e., no defect) phase defect under different focusing conditions, respectively. A comparison of the FIGS. 7A through 7C with FIGS. 7D through 7F show the significant difference in imaging under positive de-focus condition. A printed imaging for the +0.3 micron de-focus shows significantly higher exaggeration of the features with 60-degree phase defect (FIG. 7C) than with no phase defect (FIG. 7F). This property of phase defects can be utilized for defect inspection enhancement.

In some embodiments, where two identically designed PSMs or reticles are available, wafer inspection can be performed by printing alternating wafer dice with both reticles imaged out-of-focus to increase the distortion of the printed image on the wafer due to possible phase defect. In other embodiments, where only one PSM is available, alternating dice are patterned at an equal but opposite amount of de-focus. The change in the image pattern on the wafer is generally symmetric for defect free patterns with respect to focus condition. However, for patterns with defects, patterns printed at positive de-focus is significantly different than the patterns printed at negative de-focus. This property of the phase defects on PSMs have been successfully used in locating phase defects on a PSM that was not detected using conventional mask inspection methods.

Figure 8:
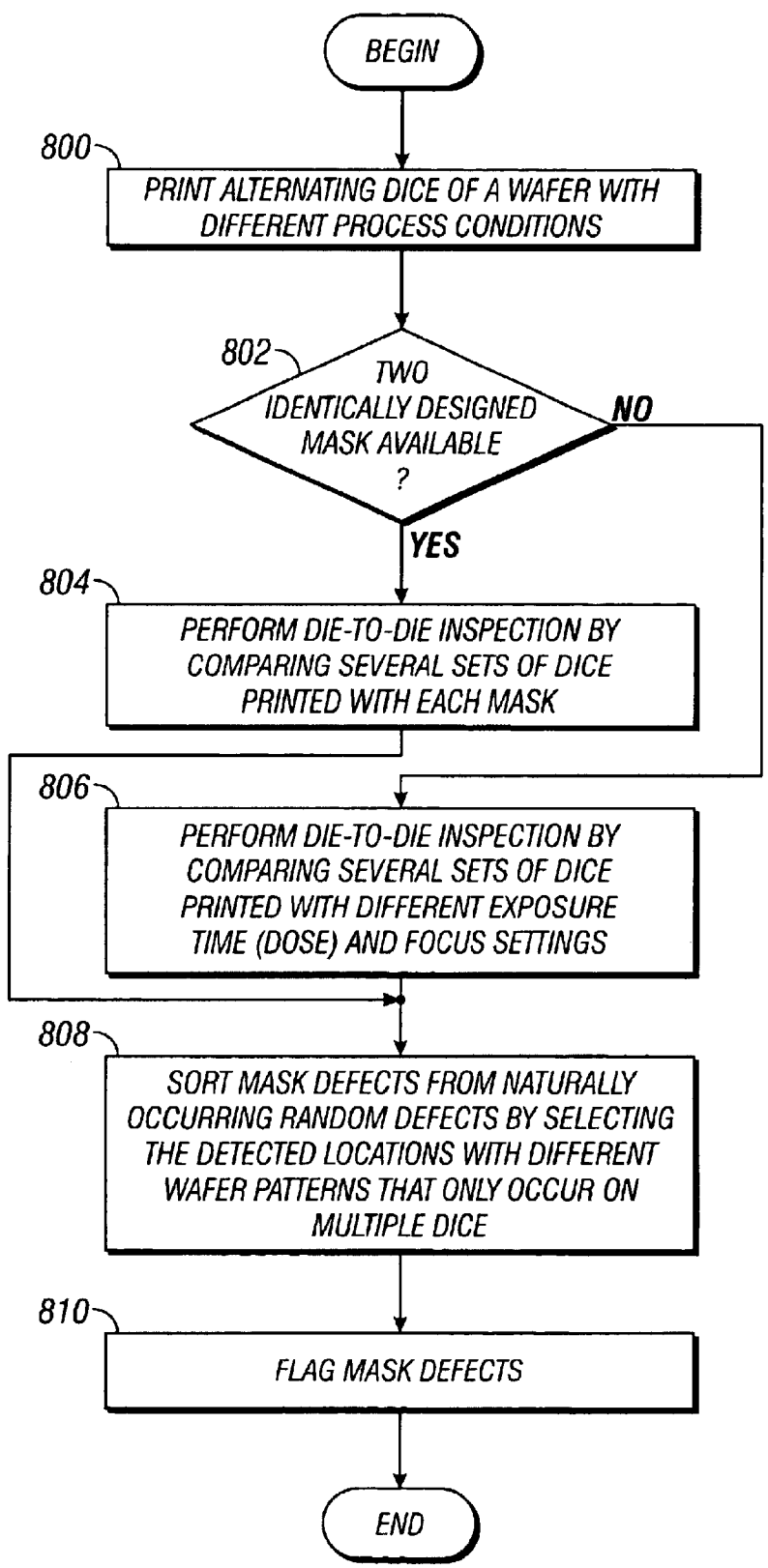
FIG. 8 is a flowchart of the inspection process for detecting defects on photomasks.

FIG. 8 is a flowchart of the inspection process for detecting defects on photomasks. The process begins, at step 800, by printing alternating dice of a silicon wafer using at least one photomask in a photo-exposure process. Each alternating die is printed with a different process condition. The different condition is selected to highlight defect areas while keeping areas without defects unchanged.

If there are two identically designed masks or reticles available (step 802), the process conditions used for the dice are the two different reticles (step 804). A die-to-die inspection is performed by comparing several sets of dice printed with each reticle. If there is only one mask available, the process conditions used are the different dose and/or focus settings configured to highlight defect areas (step 806). In some embodiments, the focus and dose settings are selected to optimize the detection sensitivity to mask defects near the OPC features.

The mask defects on a wafer are then sorted from naturally occurring random defects by selecting the detected locations with different wafer patterns (i.e. defects) that only occur on multiple dice (step 808). Finally, at step 810, the multiple defects are flagged as mask defects.

The inspection process can be implemented by an apparatus comprising a machine-readable storage medium having executable instructions that enable the machine to detect defects on at least one mask.

Other embodiments are within the scope of the following claims. For example, the alternating die patterns on a wafer can be alternating rows or a checkerboard pattern.

What is claimed is:

1. A method comprising:
   patterning each of a plurality of dice on a wafer using a first set of process conditions, the first set of process conditions including an exposure time process condition equal to a first exposure time, a focus setting process condition equal to a first focus setting, and a mask process condition equal to a first mask; and patterning each of another plurality of dice on the wafer using a second set of process conditions, the second set of process conditions including at least one process condition different from the first set of process conditions, wherein said at least one process condition is selected to determine whether a mask area includes a defect.

2. The method of claim 1, wherein the second set of process conditions includes using a second mask different than the first mask, the second mask and the first mask identically designed.

3. The method of claim 1, further comprising:
comparing the plurality of dice and the another plurality of dice; and
identifying defect features of the plurality of dice, wherein the defect features display the same pattern for the same area of each of the dice of the plurality of dice, and wherein the defect features display a different pattern for the same area of each of the dice of the another plurality of dice.

4. The method of claim 3, further comprising:
sorting the defect features to detect mask defects; and
flagging the mask defects.

5. The method of claim 1, wherein the second set of process conditions includes an exposure time different than the first exposure time.

6. The method of claim 1, wherein the second set of process conditions includes a focus setting different than the first focus setting.

7. The method of claim 1, wherein the second set of process conditions includes at least one of an exposure time different than the first exposure time and a focus setting different than the first focus setting, and wherein the at least one of an exposure time different than the first exposure time and the focus setting different than the first focus setting is selected to optimize detection sensitivity to mask defects near OPC features.

8. The method of claim 1, wherein said plurality of dice are included in a first column on the wafer, and wherein said another plurality of dice are included in a second adjacent column on the wafer.

9. The method of claim 1, wherein said plurality of dice are included in a first row on the wafer, and wherein said another plurality of dice are included in a second adjacent row on the wafer.

10. The method of claim 1, wherein said plurality of dice form a checkerboard pattern with said another plurality of dice.

11. The method of claim 1, wherein said second process conditions include a second mask different than the first mask, the second mask and the first mask identically designed, the second process conditions further including a second focus setting different than the first focus setting.

12. The method of claim 11, wherein the second focus setting is selected to optimize detection sensitivity to phase defects.

13. The method of claim 1, wherein the first focus setting includes an amount of de-focus, and wherein said second set of process conditions includes a focus setting with an equal but opposite amount of de-focus.

14. A method comprising:
patterning a each of a plurality of dice on a wafer by transmitting light through a photomask under a first set of process conditions, the first set of process conditions including an exposure time process condition equal to a first exposure time, a focus condition process condition equal to a first focus condition, and a mask process condition equal to a first mask;

patterning another plurality of dice on the wafer under a second set of process conditions including at least one process condition different than the first set of process conditions;

inspecting the plurality of dice and the another plurality of dice and flagging defects occurring on more than one of the plurality of dice.

15. The method of claim 14, wherein the second set of process conditions includes using an identically designed mask different than the first mask to pattern the another plurality of dice.

16. The method of claim 14, wherein said second set of process conditions includes an exposure time different than the first exposure time.

17. The method of claim 14, wherein said second set of process conditions includes a focus condition different than the first focus condition.

18. An apparatus comprising a machine-readable storage medium having executable instructions that enable the machine to:
initiate a patterning process to pattern a each of a plurality of dice on a wafer by transmitting light through a photomask under a first set of process condition, the first set of process conditions including an exposure time process condition equal to a first exposure time, a focus condition process conditional to a first focus setting, and a mask process condition equal to a first mask;

initiate another patterning process to pattern another plurality of dice on the wafer under a second set of process conditions different than the first set of process conditions;

initiate inspection of the plurality of dice patterned using the first set of process conditions and the another plurality of dice patterned using the second set of process conditions; and flag defects occurring on multiple dice.

19. A system comprising:
a patterning mechanism to pattern each of a plurality of dice using a first set of process conditions, the first set of process conditions including an exposure time process condition equal to a first exposure time, a focus setting process condition equal to a first focus setting, and a mask process condition equal to a first mask, the patterning mechanism to pattern each of another plurality of dice using a second set of process conditions, the second set of process conditions having at least one process condition different from the first set of process conditions, wherein the at least one process condition is selected to determine whether a mask area includes a defect; and a detection circuit configured to detect the defect in the mask area.

20. The system of claim 19, wherein said second set of process conditions includes using a second mask different than the first mask, the second mask and the first mask identically designed.

21. The system of claim 19, further comprising:
a comparison circuit to compare the plurality of dice and the another plurality of dice; and an identification mechanism configured to identify features of the plurality of dice that display different patterns for same area of the another plurality of dice.

22. The system of claim 19, further comprising:

a sorter to sort the features of the plurality of dice that display different patterns for same area of the another plurality of dice to detect and flag mask defects.

23. A system comprising:

a photo-exposure mechanism configured to pattern each of a plurality of dice on a wafer by transmitting light through a mask under a first set of process conditions, the first set of process conditions including an exposure time process condition equal to a first exposure time, a focus setting process condition equal to a first focus setting, and a mask process condition equal to a first mask, the photo-exposure mechanism further configured to pattern each of another plurality of dice on the wafer under a second set of process conditions; and a detection circuit to detect mask defects, said detection circuit to sort and flag patterns that are the same in the plurality of dice and that are different in the another plurality of dice.

* * * * *